United States Patent [19]

Damme et al.

[11] Patent Number: 5,922,502
[45] Date of Patent: Jul. 13, 1999

[54] IMAGING ELEMENT FOR MAKING A LITHOGRAPHIC PRINTING PLATE WHEREIN THAT IMAGING ELEMENT COMPRISES A THERMOSENSITIVE MASK

[75] Inventors: Marc Van Damme, Heverlee; Joan Vermeersch, Deinze; Thomas Nouwen, Meeuwen; Wim Sap, Brugge, all of Belgium

[73] Assignee: AGFA-Gevaert, N.V., Mortsel, Belgium

[21] Appl. No.: 08/845,218

[22] Filed: Apr. 21, 1997

[30] Foreign Application Priority Data

Apr. 21, 1997 [EP] European Pat. Off. ............. 96201048

[51] Int. Cl.$^6$ ............................. G03F 7/11; G03C 1/795
[52] U.S. Cl. .................. 430/162; 430/159; 430/273.1; 430/302; 430/944; 430/945
[58] Field of Search ................. 430/162, 273.1, 430/944, 159, 302, 945

[56] References Cited

U.S. PATENT DOCUMENTS

| | | | |
|---|---|---|---|
| 571,909 | 2/1896 | Fan | 430/273.1 |
| 4,132,168 | 1/1979 | Peterson | 101/471 |
| 5,262,275 | 11/1993 | Fan | 430/273.1 |
| 5,607,814 | 3/1997 | Fan et al. | 430/273.1 |
| 5,691,114 | 11/1997 | Burberry et al. | 430/302 |

*Primary Examiner*—John S. Chu
*Attorney, Agent, or Firm*—Breiner & Breiner

[57] ABSTRACT

According to the present invention there is provided an imaging element for making a lithographic printing plate comprising on a support having a hydrophilic surface a photosensitive layer and a thermosensitive layer, said thermosensitive layer being opaque to light for which said photosensitive layer has spectral sensitivity and said thermosensitive layer being capable of rendered transparent upon exposure to laser light characterised in that an intermediate layer being soluble or swellable in an aqueous medium is provided between said photosensitive layer and said thermosensitive layer.

17 Claims, No Drawings

IMAGING ELEMENT FOR MAKING A LITHOGRAPHIC PRINTING PLATE WHEREIN THAT IMAGING ELEMENT COMPRISES A THERMOSENSITIVE MASK

DESCRIPTION

1. Field of the Invention

The present invention relates to an imaging element for making a lithographic printing plate wherein that imaging element comprises a thermosensitive mask on a photosensitive coating.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. In particular it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating. After the overall exposure the silver image is removed and the photosensitive coating is developed. Such method is disclosed in for example JP-A 60-61752 but has the disadvantage that a complex development and associated developing liquids are needed.

GB 1.492.070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Systems are also known where a mask is image-wise formed on a photosensitive layer by transfer of a masking substance to the photosensitive coating, e.g. by means of laser transfer or xerography as disclosed in EP-A 1138. However, such method is generally slow and may not meet the required image resolutions for obtaining high quality prints.

3. Summary of the Invention

It is an object of the present invention to provide a method for making printing plates of high quality in a convenient way and wherein certain disadvantages of the prior art are removed.

In accordance with the present invention there is provided an imaging element for making a lithographic printing plate comprising on a support having a hydrophilic surface a photosensitive layer and a thermosensitive layer, said thermosensitive layer being opaque to light for which said photosensitive layer has spectral sensitivity and said thermosensitive layer being capable of rendered transparent upon exposure to laser light characterised in that an intermediate layer being soluble or swellable in an aqueous medium is provided between said photosensitive layer and said thermosensitive layer.

The present invention further discloses a method for obtaining a lithographic printing plate using an imaging element as defined above.

4. Detailed Description of the Invention

Thanks to the use of an intermediate layer that is soluble or swellable in an aqueous alkaline medium the following advantages are realised. Firstly, adverse effects of the thermosensitive layer on properties of the photosensitive layer such as developability thereof are avoided. Further, the sensitivity of the thermosensitive layer towards laser exposure can be improved and in particular there is no need to separate the thermosensitive layer from the imaging element prior to development since it is easily removed during development of the photosensitive layer thanks to the presence of the intermediate layer. The present invention will now be described in more detail without the intention to limit the invention to any of the embodiments described hereinafter.

a. Imaging element a.1. Thermosensitive layer

A thermosensitive layer for use in connection with the present invention comprises an infrared pigment dispersed in a binder. A particularly desirable infrared pigment is carbon black. However, other pigments can be used such as e.g. a conductive polymer particle, metal carbides, borides, nitrides, carbonitrides, bronze-structured oxides and oxides structurally related to the bronze family but lacking the A component e.g. $WO_{2.9}$.

As a binder for the thermosensitive layer, any binder can be used however, polymeric binders are especially preferred. Preferred polymeric binders include aqueous swellable or soluble binders in particular those that are swellable or soluble in an alkaline aqueous medium. Examples of suitable binders are e.g. the hydrophilic polymers mentioned hereinafter for use in the intermediate layer and/or the alkali soluble binders mentioned in the composition of the photosensitive layer.

It is further particularly desirable that a thermosensitive layer in this invention further includes a thermodegradable polymer in particular one that decomposes exothermally. In the latter case, sensitivity of the thermosensitive layer is improved. A particular example of a thermodegradable polymer that decomposes exothermally is a nitrocellulose.

A thermosensitive layer in connection with the present invention may further be cross-linked to make the imaging element less prone to damage caused during handling of the imaging element.

A thermosensitive layer in the present invention should also be opaque to light for which the photosensitive layer has spectral sensitivity. Generally used photosensitive layers and in particular those preferred in this invention are UV sensitive. A thermosensitive layer for use therewith should therefore be opaque to UV-light. According to a preferred embodiment, this may be accomplished by using an infrared pigment that also shows a substantial absorption for UV-light. A particularly preferred compound in this respect is carbon black. However, in accordance with an alternative embodiment, the thermosensitive layer may include a UV-absorbing compound capable of being ablated upon exposure to laser light in addition to a compound A capable of converting laser light into heat. Said compound A can also be present in a layer adjacent to said thermosensitive layer. Examples of such UV-absorbing compounds are UV absorbing dyes or pigments. Suitable UV absorbing masking dyes have a sufficient high extinction coefficient in the wavelength range from 300 to 450 nm so that with a reasonable amount of masking dye, the amount of UV light penetrating through the thermosensitive layer is not more than 10% and more preferably not more than 1% and most preferably not more than 0.1%. Examples of suitable UV-masking dyes are UVINUL D49, UVINUL E50 and UVINUL N539 from BASF, TINUVIN P from Ciba-Geigy, INTRAWITE OB and INTRAWITE YELLOW 2GLN from Crompton and Knowles Ltd., 4-dimethylaminobenzophenone, 4-phenylazophenol etc. The compound A is preferably an infrared absorbing compound and the laser light is preferably infrared laser light. More preferably said infrared absorbing compound is an infrared absorbing dye or a conductive polymer.

The thickness of the thermosensitive layer in connection with the present invention is preferably chosen such that sufficient opaqueness of the layer is obtained (preferably 90% or more of the light to which the photosensitive layer is responsive is absorbed by the thermosensitive layer, more preferably 99%, most preferably 99.9%) while maintaining a suitable sensitivity. Typically, the thickness of the thermosensitive layer ranges for example from 0.1 μm to about 4 μm and more preferably between 0.5 μm and 1.5 μm A thermosensitive layer in connection with the present invention may further include additional other components to realise various other desired functionalities such as e.g. visual inspection that may be realised by including a colored dye in the thermosensitive layer.

a.2. Intermediate layer

In accordance with the present invention, the imaging element preferably also includes an intermediate layer between the photosensitive layer and the thermosensitive layer. Such intermediate layer should be soluble or swellable in an aqueous medium preferably an aqueous alkaline medium. Suitable intermediate layers preferably contain a hydrophilic binder. Suitable hydrophilic binders are e.g. polyvinyl alcohol, polyvinylpyrrolidon, polyethyleneoxide, celluloses, sacharides, gelatin, carboxyl containing polymers such as e.g. homo- or copolymers of (meth)acrylic acid, maleinic acid anhydride based polymers, polymers containing phenolic hydroxy groups e.g. polyvinylphenols etc. An intermediate layer in connection with the present invention may contain various additional components e.g. a compound capable of converting laser light into heat may be desirably added to the intermediate layer.

The dry thickness of the intermediate layer is preferably comprised between 0.5 and 5 μm, more preferably between 1 and 3.5 μm.

a.3. Photosensitive layer

A photosensitive layer in accordance with the present invention may comprise any suitable light-sensitive composition from which an ink accepting image on the hydrophilic surface of the support of the imaging element can be obtained. Examples of such light-sensitive compositions used herein are those comprising diazo compounds; those comprising azide compounds as disclosed in U.K. Patent Nos. 1,235,281 and 1,495,861; those containing photocrosslinkable photopolymers as disclosed in U.S. Pat. Nos. 4,072,528 and 4,072,527 and in particular those described in more detail below.

Among these light-sensitive compositions, preferably used are those comprising diazo compounds since they are synthetically excellent in various properties such as storage properties of the photosensitive layer; developability, for instance, development latitude; image properties, e.g. quality of images; printing properties, e.g., ink receptivity and wear resistance; and low possibility of causing environmental pollution of developers used.

The light-sensitive compositions containig diazo compounds can roughly be divided in two groups, i.e. negative-working type and positive-working type ones.

The negative-working light-sensitive compositions containing diazo compounds comprise light-sensitive diazo compounds and preferably polymeric compounds. As the light-sensitive diazo compounds there may be used any ones conventionally known and preferred examples thereof are salts of organic solvent-soluble diazo resins such as salts of condensates of p-diazodiphenylamine and formaldehyde or acetaldehyde with hexafluorophosphates and salts thereof with 2-hydroxy-4-methoxybenzophenone-5-sulfonic acid salts.

On the other hand, examples of the foregoing polymeric compounds preferably used are copolymers of acrylic acid or methacrylic acid; crotonic acid copolymers; itaconic acid copolymers, maleic acid copolymers, cellulose derivatives having carboxyl groups on the side chains thereof, polyvinyl alcohol derivatives having carboxyl groups on the side chains thereof, copolymers of hydroxyalkyl (meth)acrylate having carboxyl groups on the side chains thereof, and unsaturated polyester resins having carboxyl groups.

As the diazo compounds used in a positive-working light-sensitive composition, any compounds conventionally known may be utilized and typical examples thereof are o-quinonediazides and preferably o-naphthoquinonediazide compounds. Particularly preferred are o-naphthoquinonediazidosulfonic acid esters or o-naphthoquinone diazidocarboxylic acid esters of various hydroxyl compounds; and o-naphthoquinonediazidosulfonic acid amides or o-naphthoquinonediazidocarboxylic acid amides of various aromatic amine compounds. Examples of such phenols include phenol, cresol, resorcin and pyrogallol; examples of such carbonyl group-containing compounds are formaldehyde, benzaldehyde and acetone. Examples of preferred hydroxyl compounds include phenol-formaldehyde resin, cresol-formaldehyde resin, pyrogallol-acetone resin and resorcin-benzaldehyde resin.

Typical examples of o-quinonediazide compounds include esters of benzoquinone-(1,2)-diazidosulfonic acid or napthoquinone-(1,2)-diazidosulfonic acid and phenol-formaldehyde resin or cresol-formaldehyde resin; ester of naphthoquinone-(1,2)-diazido-(2)-5-sulfonic acid and pyrogallol-acetone resin as disclosed in U.S. Pat. No. 3,635,709; and ester of naphthoquinone-(1,2)-diazido-(2)-5-sulfonic acid and resorcin-pyrogallol-acetone copolycondensates as disclosed in J.P. KOKAI No. Sho 55-76346.

Examples of other useful o-quinonediazide compounds are polyesters having hydroxyl groups at their termini esterified with o-napthoquinonediazidesulfonyl chloride as disclosed in J.P. KOKAI No. Sho 50-117503; homopolymers of p-hydroxystyrene or copolymers thereof with other copolymerizable monomers esterified with o-naphtoquinonediazidosulfonyl chloride as disclosed in J.P. KOKAI No. Sho 50-113305; ester of bisphenol-formaldehyde resin and o-quinonediazidosulfonic acid as disclosed in J.P. KOKAI No. Sho 54-29922; condensates of alkyl acrylate-acryloyoxyalkyl carbonate-hydroxyalkyl acrylate copolymers with o-naphthoquinonediazosulfonyl chloride as disclosed in U.S. Pat. No. 3,859,099; reaction products of copolymerized products of styrene and phenol derivatives with o-quinonediazidosulfonic acid as disclosed in J.P. KOKOKU No. Sho 49-17481; amides of copolymers of p-aminostyrene and monomers copolymerizable therewith and o-naphthoquinonediazidosulfonic acid or o-naphthoquinonediazidocarboxylic acid as disclosed in U.S. Pat. No. 3,759,711; as well as ester compounds of polyhydroxybenzophenonef and o-naphthoquinonediazidosulfonlyl chloride.

These o-quinonediazide compounds may be used alone, but are preferably used as a mixture with an alkalki-soluble resin to form a light-sensitive layer.

Preferred alkali-soluble resins include novolak type phenol and typical examples thereof are phenolformaldehyde, cresol-formaldehyde resin, and phenol-cresol-formaldehyde copolycondensed resins as disclosed in J.P. KOKAI No. Sho 55-57841. More preferably, the foregoing phenol resins are simultaneously used with a condensate of phenol or cresol substituted with an alkyl group having 3 to 8 carbon atoms and formaldehyde such as t-butylphenol-formaldehyde, as described in J.P. KOKAI No. Sho 50-125806.

Moreover, it is also possible to optionally incorporate, into the light-sensitive composition, alkali-soluble polymers other than the above listed alkali-soluble novolak phenolic resins. Examples of such polymers are styrene-acrylic acid copolymer, methyl methacrylate-methacrylic acid copolymer, alkali-soluble polyurethane resin, and alkali-soluble vinylic resins and alkali-soluble polybutyral resins as disclosed in J.P. KOKOKU No. Sho 52-28401.

The amount of the o-quinonediazide compounds is preferably 5 to 80% by weight and more preferably 10 to 50% by weight based on the total weight of the solid contents of the light-sensitive composition. On the other hand, that of the alkali-soluble resins is preferably 30 to 90% by weight and more preferably 50 to 85% by weight based on the total weight of the solid contents of the light-sensitive composition.

A photosensitive layer in connection with this invention may be applied in the form of a multilayered structure.

Moreover, the light-sensitive composition in the photosensitive layer or multilayer package may further comprise optional components such as dyes, plasticizers and components for imparting printing-out properties (ability of providing a visible image immediately after imagewise exposure).

The coated amount of a photosensitive layer applied onto the hydrophilic surface of a support preferably ranges from 0.1 to 7 $g/m^2$ and more preferably 0.5 to 4 $g/m^2$.

Preferred photo-crosslinking materials in the present invention are based on photo-crosslinking polymers having a maleimido group at their side chain. In order to elevate their photosensitivity sensitisers are added such as thioxanthones, benzophenone, Michler's ketone, anthraquinones, anthracene, chrysene, p-dinitrobenzene, 2-nitrofluorene, as well as sensitizers described in JP-A-62-294238, JP-A-2-173646, JP-A-2-236552, JP-A-3-54566 and JP-A-6-107718. (The term "JP-A" as used herein means an "unexamined published Japanese patent application".)

A photo-crosslinking polymer having a maleimido group at its side chain(s) includes, for example polymers that are described in, U.S. Pat. No. 4,079,041 (corresponding to JP-A-52-988); West German Patent 2,626,769; European Patents 21,019 and 3,552; Die Angewandte Makromolekulare Chemie, 115 (1983), pp. 163–181; JP-A-49-128991 to JP-A-49-128993, JP-A-50-5376 to JP-A-50-5380, JP-A-53-5298 to JP-A-53-5300, JP-A-50-50107, JP-A-51-47940, JP-A-52-13907, JP-A-50-45076, JP-A-52-121700, JP-A-50-10844, JP-A-50-45087, JP-A-58-43951; West German Patents 2,349,948 and 2,616,276.

Of these polymers, those having, at their side chains, two or more maleimido groups on average in one molecule and having a mean molecular weight of 1000 or more are preferably used in the present invention.

An imaging element containing any of these polymers is preferably developed with an aqueous alkaline developer substantially not containing an organic solvent, in view of the environmental safety. Thereore, it is preferable that these polymers are soluble in or swellable with aqueous alkalis. Accordingly, it is preferably that monomers having a maleimido group at its side chain are copolymerized with monomers having a alkali-soluble group to obtain these polymers.

As the alkali-soluble group, preferred are acid groups having a pKa of 14 or less. Specific examples of such monomers having an alkali-soluble group include vinyl monomers having a carboxyl group, such as acrylic acid, methacrylic acid, maleic acid, itaconic acid; vinyl monomers having a —$CONHSO_2$-group; vinyl monomers haivng an —$SO_2NH$-group; vinyl monomers having a phenolic hydroxyl group; vinyl monomers having a phosphoric acid group or a phosphonic acid group; as well as maleic anhydride, and itaconic anhydride.

The alkali-soluble group having monomer and the maleido group having monomer are generally copolymerized at a ratio of from 10/90 to 70/30 by mol, preferably from 20/80 to 60/40 by mol, to easily give a photo-crosslinking polymer for use in the present invention. The polymer has preferably an acid value of from 30 to 500, especially preferably from 50 to 300.

Of such photo-crosslinking polymers, especially useful are copolymers composed of an N-[2-methacryloyloxy) alkyl]-2,3-dimethylmaleimide and methacrylic acid or acrylic acid, such as those described in Die Angewandte Makromolekulare Chemie, 128 (1984), pp. 71–91. In producing these copolymers, vinyl monomers may additionally copolymerized, as the third component, to easily give polynary copolymers as desired. For instance, alkyl methacrylates or alkyl acrylates of which homopolymers have a glass transition temperature not higher than room temperature can be copolymerized as the third component to give flexible copolymers.

A photo-crosslinking polymer for use in the present invention has preferably a weight average molecular weight of 1000 or more, more preferably from 10,000 to 500,000, and even more preferably from 20,000 to 300,000.

As mentioned above, it is desirable to add a sensitizer to a photosensitive layer having a photocross-linkable polymer as described above. Preferred is a triplet sensitizer having an absorption peak for ensuring sufficient light absorption at 300 nm or more.

Examples of such sensitizer include benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, naphthofranone compounds, pyrylium salts, and thiapyrylium salts.

Specific examples thereof include Michler's ketone, N,N'-diethylaminobenzophenone, benzanthrone, (3-methyl-1,3-diazo-1,9-benz)anthronepicramide, 5-nitroacenaphthene, 2-chlorothioxanthone, 2-isopropylthioxanthone, dimethylthioxanthone, methylthioxanthone-1-ethyl carboxylate, 2-nitrofluorenone, 2-dibenzoylmethylene-3-methylnaphthothiazoline, 3,3-carbonyl-bis-(7-diethylaminocoumarin), 2,4,6-triphyenlthiapyrylium perchlorate, 2-(p-chlorobenzoy)naphthothiazole, as well as sensitizers described in Jp-B-45-8832, JP-A-52-129791, JP-A-62-294238, JP-A-2-173646, JP-A-2-131236, European Patent 368,327, JP-A-2-236552, JP-A-3-54566 and JP-A-6-107718.

Of these, preferred are the sensitizers described in JP-A-2-236552, JP-A-3-54566 and JP-A-6-107718; and especially preferred are the sensitizers having one or more of —COOH, —NHSO$_2$R$^{20}$, —CONHCOR$^{20}$ and/or —CONHSO$_2$R$^{20}$ (where R$^{20}$ represents an alkyl group, an aromatic group or an alkyl-aromatic group) as an alkali-soluble group in one molecule, described in JP-A-6-107718.

The amount of sensitizer in the photosensitive layer is conveniently from 1 to 20% by weight, preferably from 2 to 15% by weight, and more preferably from 3 to 10% by weight, of the total amount of the compositions in the photosensitive layer.

In addition to the photocross-linkable polymers described above it may be desirable to add a diazo resin to the photosensitive layer. Examples of diazo resins include co-condensates composed of aromatic diazonium compounds and aldehydes. Specific examples thereof include the diazo resins described in JP-B-49-48001, JP-B-50-7481, JP-B-5-2227, JP-A-3-2864, JP-A-3-240061, and JP-A-4-274429.

Of these, preferred are diazo resins having a carboxyl group in the molecule, for example, diazo resins obtained by co-condensation with aromatic compounds having at least one carboxyl group, such as those described in JP-A-3-240061, and diazo resins obtained by condensation with aldehydes having a caboxyl group, such as those described in JP-A-2864.

The amount of the diazo resin in the photosensitive layer is preferably from 0.1 to 30% by weight, preferably from 0.5 to 10% by weight, and more preferably from 1 to 5% by weight of the total amount of the compositions in the photosensitive layer.

Further, there may be added a polymer having one or more polymerisable groups such as the polymers disclosed in JP-B-3-63740, U.S. Pat. Nos. 3,376,138, 3,556,793.

The above-mentioned polymer having one or more polymerisable groups is preferably soluble in or swellable with aqueous alkaline developers, like the polymers having a maleimido group at the side chain. Therefore, this polymer is preferably a copolymer composed of one or more monomers having an alkali-soluble group, e.g. as mentioned above.

a.4. Support

In accordance with the present invention, an imaging element comprises a support having a hydrophilic surface. Suitable supports for use in this invention are e.g. metal supports in particular grained and anodised aluminium or supports comprising a substrate such as e.g. paper or plastic film provided with a hydrophilic layer, preferably a hydrophilic layer that is cross-linked.

A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in accordance with the present invention preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas. The thickness of a cross-linked hydrophilic layer may vary in the range of 0.2 to 25 μm and is preferably 1 to 10 μm.

Further particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As substrate on which the hydrophilic layer is provided it is particularly preferred to use a plastic film e.g. substrated polyethylene terephthalate film, cellulose acetate film, polystyrene film, polycarbonate film etc. The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is between 200 mg per m$^2$ and 750 mg per m$^2$. Further, the ratio of silica to hydrophilic binder is preferably more than 1 and the surface area of the colloidal silica is preferably at least 300 m$^2$ per gram, more preferably a surface area of 500 m$^2$ per gram.

b. Method for making a lithographic printing plate b.1 image-wise exposure

Image-wise exposure in connection with the present invention involves the use of a laser emitting in the infrared (IR), i.e. emitting in the wavelength range above 700 nm, preferably 700–1500 nm. Particularly preferred for use in connection with the present invention are laser diodes emitting around 830 nm (gallium-arsenide laser diodes) or a NdYAG-laser emitting at 1060 nm.

A preferred imaging apparatus suitable for image-wise exposure in accordance with the present invention preferably includes a laser output that can be provided directly to the imaging elements surface via lenses or other beam-guiding components, or transmitted to the surface of a blank imaging element from a remotely sited laser using a fiber-optic cable. A controller and associated positioning hardware maintains the beam output at a precise orientation with respect to the imaging elements surface, scans the output over the surface, and activates the laser at positions adjacent selected points or areas of the imaging element. The controller responds to incoming image signals corresponding to the original document and/or picture being copied onto the imaging element to produce a precise negative or positive image of that original. The image signals are stored as a bitmap data file on a computer. Such files may be generated by a raster image processor (RIP) or other suitable means. For example, a RIP can accept Input data in page-description language, which defines all of the features required to be transferred onto the imaging element, or as a combination of page-description language and one or more image data files. The bitmaps are constructed to define the hue of the color as well as screen frequencies and angles in case of amplitude modulation screening. However, the present invention is particularly suitable for use in combination with frequency modulation screening as disclosed in e.g. EP-A 571010, EP-A 620677 and EP-A 620674.

The imaging apparatus for use in the present invention is preferably configured as a flatbed recorder or a drum recorder with the imaging element mounted to exterior cylindrical surface of the drum. In a preferred drum configuration, the requisite relative motion between the laser beam and the imaging element is achieved by rotating the drum(and the imaging element mounted thereon) about its axis and moving the beam parallel to the rotation axis, thereby scanning the imaging element circumferentially so the image "grows" in the axial direction. Alternatively, the beam can move parallel to the drum axis and, after each pass across the imaging element, increment angularly so that the image on the imaging element "grows" circumferentially. In both cases, after a complete scan by the beam and development, an image corresponding to the original will have been applied to the surface of the imaging element. In the flatbed configuration, the beam is drawn across either axis of the imaging element, and is indexed along the other axis after each pass. Of course, the requisite relative motion between the beam and the imaging element may be produced by movement of the imaging element rather than (or in addition to) movement of the beam.

Regardless of the manner in which the beam is scanned, it is generally preferable (for reasons of speed) to employ a plurality of lasers and guide their outputs to a single writing array. The writing array is then indexed, after completion of each pass across or along the imaging element, a distance determined by the number of beams emanating from the array, and by the desired resolution (i.e. the number of image points per unit length).

b.2. overall exposure

Overall exposure in connection with the present invention is carried by means of a light source that emits at least in the wavelength range for which the photosensitive layer of an imaging element in connection with the present invention has spectral sensitivity. In a practical embodiment in this invention, the photosensitive layer is UV-sensitive and/or optionally sensitive to the short wavelength part of the visible spectrum e.g. upto green. Overall exposure may for example be carried out by exposure sources such as high or medium pressure halogen mercury vapour lamps, e.g. of 1000 W.

b.3. development

Development in connection with the present invention is carried out by a suitable liquid capable of removing either the exposed or non-exposed areas of the photosensitive layer. The appropriate composition of a developing liquid in the present invention will depend on the kind of photosensitive layer and preferably is such that during development, the thermosensitive layer and optional intermediate layer are removed at the same time.

For ecological reasons, it is highly preferred that an aqueous based developing liquid is used preferably without additional organic solvents. A particularly preferred developing liquid is an aqueous alkaline liquid.

Particularly suitable developing liquids for use with the preferred photosensitive coatings described above are as follows.

A developer preferably used in the invention is an aqueous solutions mainly composed of alkali metal silicates and alkali metal hydroxides. As such alkali metal silicates, preferably used are, for instance, sodium silicate, potassium silicate, lithium silicate and sodium metasilicate. On the other hand, as such alkali methal hydroxides, preferred are sodium hydroxide, potassium hydroxide and lithium hydroxide. From the viewpoint of preventing the formation of insoluble precipitates, it is particularly desirable that the developer comprise at least 20 mole % of potassium with respect to the total amount of alkali metals in the aqueous developing solution.

The developers used in the invention may simultaneously contain other alkaline agents. Examples of such other alkaline agents include such inorganic alkaline agents as ammonium hydroxide, sodium tertiary phosphate, sodium secondary phosphate, potassium tertiary phosphate, potassium secondary phosphate, ammonium tertiary phosphate, ammonium secondary phosphate, sodium bicarbonate, sodium carbonate, potassium carbonate and ammonium carbonate; and such organic alkaline agents as mono-, di- or triethanolamine, mono-, di- or trimethylamine, mono-, di- or triethylamine, mono-, di- or isopropylamine, n-butylamine, mono-, di- or triisopropanolamine, ethyleneimine, ethylenediimine and tetramethylammonium hydroxide.

It is particularly desirable that the molar ratio of silicate [$SiO_2$] to alkali metal oxide [$M_2O$] in a developer for use with this invention is from 0.6 to 1.5, preferably 0.7 to 1.3. In addition, the concentration of $SiO_2$ in the replenisher preferably ranges from 2 to 4% by weight.

In a developer used in the present invention, it is possible to simultaneously use organic solvents having solubility in water at 20° C. of not more than 10% by weight according to need. Examples of such organic solvents are such carboxilic acid esters as ethyl acetate, propyl acetate, amyl acetate, benzyl acetate, ethylene glycol monobutyl acetate, butyl lactate and butyl levulinate; such ketones as ethyl butyl ketone, methyl isobutyl ketone and cyclohexanone; such alcohols as ethylene glycol monobutyl ether, ethylene glycol benzyl ether, ethylene glycol monophenyl ether,, benzyl alcohol, methylphenylcarbinol, n-amyl alcohol and methylamyl alcohol; such alkyl-substituted aromatic hydrocarbons as xylene; and such halogenated hydrocarbons as methylene dichloride and monochlorobenze. These organic solvents may be used alone or in combination. Particularly preferred is benzyl alcohol in the invention. These organic solvents are added to the developer generally in an amount of not more than 5% by weight and preferably not more than 4% by weight.

A developer used in the present invention may simultaneously contain a surfactant for the purpose of improving developing properties thereof. Examples of such surfactants include salts of higher alcohol ($C_8$~$C_{22}$) sulfuric acid esters such as sodium salt or lauryl alcohol sulfate, sodium salt of octyl alcohol sulfate, ammonium salt of lauryl alcohol sulfate, Teepol B-81 (trademark available from Shell Chemicals Co., Ltd.) and disodium alkyl sulfates; salts of aliphatic alcohol phosphoric acid esters such as sodium salt of cetyl alcohol phosphate; alkyl aryl sulfonic acid salts such as sodium salt of dodecylbenzene sulfonate, sodium salt of isopropylnapthalene sulfonate, sodium salt of dinaphthalene disulfonate and sodium salt of metanitrobenze sulfonate; sulfonic acid salts of alkylamides; and sulfonic acid salts of dibasic aliphatic acid esters such as sodium dioctyl sulfosuccinate and sodium dihexyl sulfosuccinate. These surfactants may be used alone or in combination. Particularly preferred are sulfonic acid salts. These surfactants may be used in an amount of generally not more than 5% by weight and preferably not more than 3% by weight.

In order to enhance developing stability of the developers the following compounds may simultaneously be used.

Examples of such compounds are neutral salts such as NaCl and KBr as disclosed in J.P. KOKAI No. Sho 58-75152; chelating agents such as EDTA and NTA as disclosed in J.P. KOKAI No. Sho 58-190952 (U.S. Pat. No. 4,469,776); complexes such as $[Co(NH_3)_6]Cl_3$ as disclosed in J.P. KOKAI No. Sho 59-121336 (U.S. Pat. No. 4,606, 995); ionizable compounds of elements of the group IIa, IIIa or IIIb of the Periodic Table such as disclosed in J.P. KOKAI No. Sho 55-25100; anionic or amphoteric surfactants such as sodium alkyl naphthalene sulfonate and N-tetradecyl-N, N-dihydroxyethyl betaine as disclosed in J.P. KOKAI No. Sho 50-51324; tetramethyldecyne diol as disclosed in U.S. Pat. No. 4,374,920, nonionic surfactants as disclosed in J. P. KOKAI No. Sho 60-213943; cationic polymers such as methyl chloride quaternary products of p-dimethylaminomethyl polystyrene as disclosed in J.P. KOKAI No. Sho 55-95946; amphoteric polyelectrolytes such as copolymer of vinylbenzyl trimethylammonium chloride and sodium sulfites as disclosed in J.P. KOKAI No. Sho 56-142528; reducing inorganic salts such as sodium sulfite as disclosed in J.P. KOKAI No. Sho 57-192952 (U.S. Pat. No. 4,467,027) and alkaline-soluble mercapto compounds or tioether compounds such as thiosalicylic acid, cysteine and thioglycolic acid; inorganic lithium compounds such as lithium chloride as disclosed in J.P. KOKAI No. Sho 58-95444; organic lithium compounds such as lithium benzoate as disclosed in Japanese Patent Publication for Opposition Purpose (hereinafter referred to as J.P. KOKOKU) No. Sho 50-34442; organicometallic surfactants cotaining Si, Ti or the like as disclosed in J.P. KOKAI No. Sho 59-75255; organoboron compounds as disclosed in J.P. KOKAI No. Sho 59-84241 (U.S. Pat. No. 4,500,625); quaternary ammonium salts such as tetraalklammonium oxides as disclosed in European Patent No. 101,010; and bacterides such as sodium dehydroacetate.

In accordance with a method of the present invention the imaging element is wiped with a cleaning means, preferably a dry cleaning means e.g. a cotton pad or a paper towel after the image-wise exposure and before the overall exposure is effected. This is particularly preferred when the thermosensitive layer comprises carbon black or a metallic pigment.

In accordance with the present invention the imaging element can also be processed after mounting the image-wise and overall exposed imaging element on a print cylinder of a printing press. This is especially suitable for imaging elements which can be processed by water or a water-alcohol solution. Such imaging elements are described in EP-A 631189 which therefor is incorporated herein by reference. According to a preferred embodiment, the printing press is then started and while the print cylinder with the imaging element mounted thereon rotates, the dampener rollers that supply dampening liquid are dropped on the imaging element and subsequent thereto the ink rollers are dropped. Generally after about 10 revolutions of the print cylinder the first clear and useful prints are obtained.

According to an alternative method, the ink rollers and dampener rollers may be dropped simultaneously or the ink rollers may be dropped first.

Suitable dampening liquids that can be used in connection with the present invention are aqueous solutions generally having an acidic pH and comprising an alcohol such as isopropanol. With regard to dampening liquids useful in the present invention, there is no particular limitation and commercially available dampening liquids, also known as fountain solutions, can be used.

According to an alternative method, the imaging element is first mounted on the print cylinder of the printing press and then image-wise and overall exposed directly on the press. Subsequent to exposure, the imaging element can be developed as described above. Suitable imaging elements for an image-wise exposure on the press are said imaging elements which can be developed while mounted on the print cylinder of the printing press as described above.

The present invention will now be further illustrated by way of the following examples without any intention to limit the invention thereto. All parts are by weight unless stated otherwise.

EXAMPLE

Preparation of a Lithographic Base.

To 440 g of a dispersion containing 21.5% $TiO_2$ (average particle size 0.3 to 0.4 μm) and 2.5% polyvinyl alcohol in deionized water were subsequently added, while stirring, 250 g of a 5% polyvinyl alcohol solution in water, 105 g of a hydrolyzed 22% tetramethylorthosilicate emulsion in water and 12 g of a 10% solution of a wetting agent.

To this mixture was added 193 g of deionized water and the pH was adjusted to pH=4.

The obtained dispersion was coated on a polyethylenterephthalate film support (coated with a hydrophilic adhesion layer) to a wet coating thickness of 50 g/m², dried at 30° C., and subsequently hardened by subjecting it to a temperature of 57° C. for 1 week. To this base was further provided an aqueous solution of (pH=5) of Dormacid (a dextran modified with a diethylaminoethyl group available from Pfeifer & Langen) and a cationic wetting agent to a dry coating thickness of 30 mg Dormacid per m². The obtained element was then heated for 1 week at 57° C.

Preparation of the Imaging Element.

An imaging element according to the invention was produced by preparing the following light-sensitive compositions.

Preparation of the UV-Sensitive Coating.

To 63 g of a 20% dispersion of polymethylmethacrylate (particle diameter of 40 nm) stabilized with cetyltrimethylammoniumbromide in deionized water was subsequently added, while stirring, 120 g of a 5% solution of a 98% hydrolized polyvinylacetate, having a weight average molecular weight of 200 000 g/mol (MOWIOL 56-98 available from Hoechst), in water and 15 g of a dispersion containing 10% of Heliogen Blue D 7565 (available from BASF) and 5% polyvinylalcohol (MOWIOL 56-98) in water. 46 g of a 15% solution of the condensation product of diphenylamine diazonium salt and formaldehyde (NEGALUX N18 available from PCAS) and 20 g of a 15% solution of the condensation product of methoxydiphenylamine diazonium salt and formaldehyde (DIAZO No. 8 available from Fairmount) in water was then slowly added. Finally 30 g of a 1.6% solution of cationic fluor containing surfactant (Fluorad FC135 available from 3 M) in water, and 726 ml of water were added. The UV-sensitive composition was coated to the above described lithographic base in an amount of 35 g/m² (wet coating amount) and then dried at 30° C.

On this UV-photosensitive coating a polyethyleneglycol layer was coated. This layer was coated from a 4% solution of polyethyleneglycol (ANTAROX E4000 commercially available from GAF) in an amount of 20 g/m² (wet coating amount).

Preparation of the IR-Sensitive Coating.

The IR-sensitive formulation contains the following ingredients in parts by weight, as indicated.

| | |
|---|---|
| Methyl-ethyl ketone | 834.5 |
| Nitrocellulose E620 (available from Wolff Walsrode) | 25.5 |
| (UV-absorber) | 25 |
| (IR-dye 1) | 10 |
| (IR-dye 2) | 50 |
| (Cyan-dye 1) | 7.5 |
| (Cyan-dye 2) | 14.5 |
| (Magenta-dye 1) | 11 |
| (Magenta-dye 2) | 6.5 |
| (Yellow-dye 1) | 8 |
| (Yellow-dye 2) | 7.5 |

UV-absorber

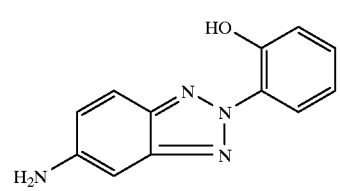

IR dye 1

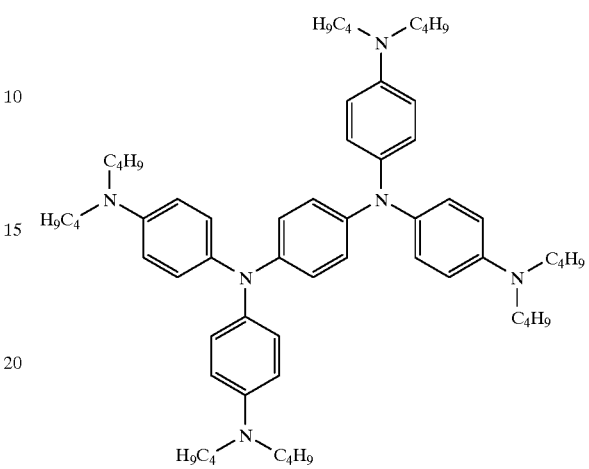

IR dye 2

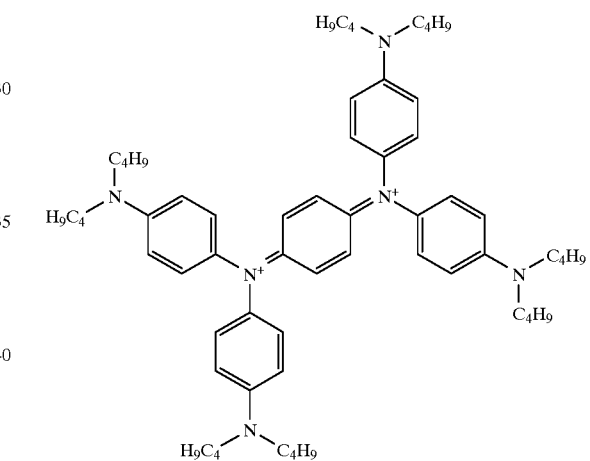

Cyan dye 1

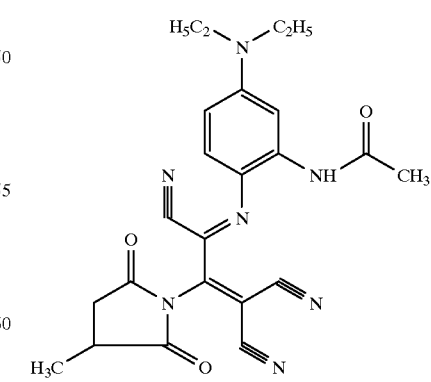

Cyan dye 2

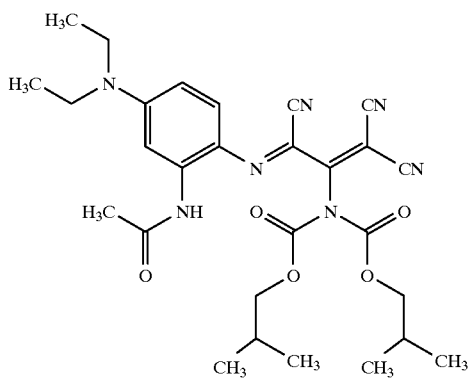

Magenta dye 1

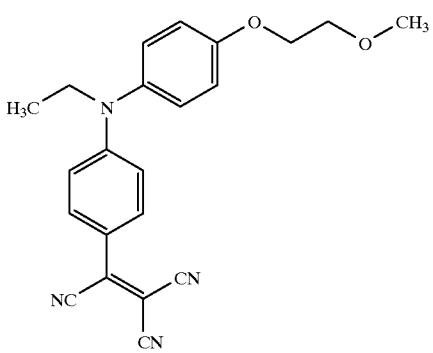

Magenta dye 2

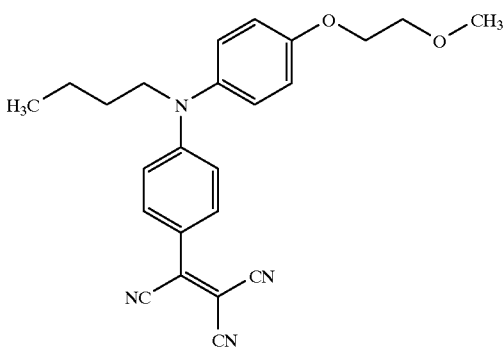

Yellow dye 1

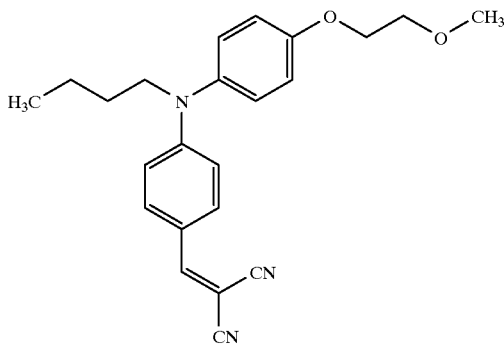

Yellow dye 2

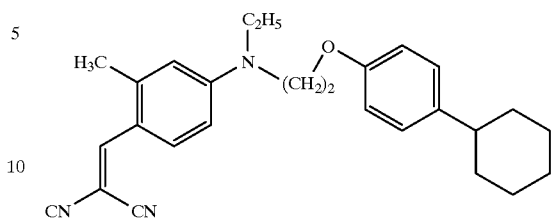

The UV-sensitive layer was overcoated by means of a knife coater with the IR-sensitive formulation to a wet coating thickness of 20 μm.

Preparation of a Printing Plate and Making Copies of the Original

An imaging element as described above was subjected to a scannnig Nd YLF infrared laser emitting at 1050 nm (scan speed 1.1 m/s, spot size 15 μm and 400 mW power on the surface of the imaging element). After this exposure the IR-sensitive mask had disappeared in areas exposed to the laser-beam.

Subsequently, the imaging element was exposed to a high pressure halogen mercury vapour lamp of 1000 W at a distance of 70 cm for 90 s.

Further the imaging element was subjected to a developing process with water, hereby removing the non-image parts.

After development, the imaging element was mounted on a GTO 46 offsetpress. As an ink was used K+E 123 W and as a fountain solution Rotamatic. Printing was started and a good printing quality was obtained without any ink uptake in the non-image parts.

Example 2

On a Ozasol N61 plate was coated a 2.5 wt % aqueous solution of polyvinylalcohol (MOWIOL 56-98) in an amount of 40 g/m$^2$ (wet coating amount) and then dried at 40° C.

On top of this polyvinylalcohol layer an IR-sensitive mask as described in example 1 was coated.

After laser-exposure the IR-sensitive mask had (as in example 1) disappeared in areas exposed to the laser-beam.

Subsequently, the imaging element was exposed to a high pressure halogen mercury vapour lamp of 1000 W at a distance of 70 cm for 50 s.

Further the imaging element was subjected to a developing process with the aqueous alkaline developer Fuji DN-5, hereby removing the non-image parts.

After development, the imaging element was mounted on a GTO 46 offsetpress. As an ink was used K+E 123 W and as a fountain solution Rotamatic. Printing was started and a good printing quality was obtained without any ink uptake in the non-image parts.

We claim:

1. An imaging element for making a lithographic printing plate comprising on a support having a hydrophilic surface a photosensitive layer and a thermosensitive layer, said thermosensitive layer being opaque to light for which said photosensitive layer has spectral sensitivity and said thermosensitive layer being capable of rendered transparent upon exposure to laser light wherein an intermediate layer being soluble or swellable in an aqueous medium is provided between said photosensitive layer and said thermosensitive layer.

2. An imaging element according to claim 1 wherein said photosensitive layer is UV-sensitive and said thermosensitive layer is opaque to UV-light.

3. An imaging element according to claim 2 wherein said thermosensitive layer comprises carbon black.

4. An imaging element according to claim 2 wherein said thermosensitive layer includes a UV absorbing dye capable of being ablated upon said exposure to laser light and rendering said thermosensitive layer opaque to UV-light and wherein said thermosensitive layer or an adjacent layer thereto includes a compound A capable of converting said laser light to heat.

5. An imaging element according to claim 4 wherein said compound is an infrared absorbing compound and said laser light is infrared laser light.

6. An imaging element according to claim 5 wherein said infrared absorbing compound is an infrared absorbing dye or a conductive polymer.

7. An imaging element according to claim 1 wherein said thermosensitive layer comprises a thermally degradable polymer.

8. An imaging element according to claim 1 wherein said photosensitive layer comprises an alkali soluble or alkali swellable copolymer of a maleimide.

9. An imaging element according to claim 1 wherein said photosensitive layer comprises a diazo resin or a diazonium compound.

10. An imaging element according to claim 1 wherein said intermediate layer is soluble or swellable in an aqueous alkaline medium.

11. A method for making a lithographic printing plate comprising the steps of:

image-wise exposing an imaging element as defined in claim 1 by means of a laser thereby image-wise rendering said thermosensitive layer transparent to light for which said photosensitive layer has spectral sensitivity;

overall exposing a thus obtained imaging element with light for which said photosensitive layer has spectral sensitivity;

developing a thus obtained imaging element thereby removing said intermediate layer, thermosensitive layer and either the non-exposed or the exposed areas of said photosensitive layer so as to leave an ink accepting image of said photosensitive layer on said support.

12. A method according to claim 11 wherein said imaging element is mounted on a drum and said image-wise exposure is an internal or external drum exposure.

13. A method according to claim 12 wherein said laser is an infrared laser.

14. A method according to claim 11 wherein said image-wise exposure is carried out by means of an array of infrared laser diodes.

15. A method according to claim 11 wherein said imaging element is wiped with a cleaning means after the image-wise exposure and before the overall exposure is effected.

16. A method according to claim 11 wherein said imaging element is processed after mounting the image-wise and overall exposed imaging element on a print cylinder of a printing press.

17. A method according to claim 11 wherein said imaging element is image-wise and overall exposed while being mounted on the print cylinder of a printing press.

* * * * *

UNITED STATES PATENT AND TRADEMARK OFFICE
CERTIFICATE OF CORRECTION

PATENT NO.   : 5,922,502                                   Page 1 of 1
DATED        : July 13, 1999
INVENTOR(S)  : Marc Van Damme et al.

It is certified that error appears in the above-identified patent and that said Letters Patent is hereby corrected as shown below:

Title page,
Item [30], should read:
   -- [30] Foreign Application Priority Data
April 23, 1996 [EP] European Patent Office..............96201048 --

Between items [73] and [21], insert the following:
   -- Related U.S. Application Data
[60] Provisional Application No. 60/019,375.June 5, 1999 --

Column 11,
Line 29, "(trademark available from Shell Chemicals Co., Ltd.)" should read
-- (trademark: available from Shell Chemicals Co., Ltd.) --.

Column 16,
Line 5, the formula for "Yellow dye 2" should read

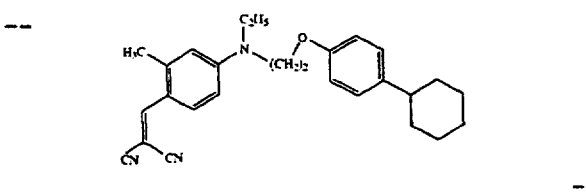

Signed and Sealed this

Eighteenth Day of December, 2001

Attest:

JAMES E. ROGAN
*Attesting Officer*   *Director of the United States Patent and Trademark Office*